United States Patent
Hohmann et al.

(10) Patent No.: US 6,751,449 B1
(45) Date of Patent: Jun. 15, 2004

(54) CIRCUIT CONFIGURATION FOR BAND CHANGEOVER IN HIGH-FREQUENCY RECEIVERS

(75) Inventors: Henning Hohmann, München (DE); Bernd Pflaum, Unterhaching (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/702,027

(22) Filed: Oct. 30, 2000

Related U.S. Application Data

(63) Continuation of application No. PCT/DE99/01165, filed on Apr. 16, 1999.

(30) Foreign Application Priority Data

Apr. 30, 1998 (DE) .......................................... 198 19 544

(51) Int. Cl.$^7$ ................................................. H04Q 7/20
(52) U.S. Cl. .................................. 455/188.1; 455/188.2
(58) Field of Search ........................... 455/168.1, 173.1, 455/176.1, 179.1, 182.1, 182.3, 187.1, 188.1, 188.2, 194.2, 195.1, 191.3, 333, 552.1; 348/731, 732, 733; 333/211; 334/18, 87

(56) References Cited

U.S. PATENT DOCUMENTS

| | | | | |
|---|---|---|---|---|
| 3,662,271 A | * | 5/1972 | Nakanishi | 455/180.4 |
| 3,983,490 A | | 9/1976 | Ma | |
| 4,438,529 A | | 3/1984 | Sato | |
| 4,823,099 A | * | 4/1989 | Leipert | 334/15 |
| 4,851,796 A | * | 7/1989 | Hendriks | 333/129 |
| 5,115,317 A | * | 5/1992 | Igarashi et al. | 348/731 |
| 5,214,399 A | * | 5/1993 | Hohmann | 334/1 |
| 6,052,569 A | * | 4/2000 | Ehrhardt | 455/188.1 |

FOREIGN PATENT DOCUMENTS

| | | |
|---|---|---|
| EP | 0 065 013 A1 | 11/1982 |
| EP | 0 457 932 A1 | 11/1991 |
| EP | 0 457 934 A1 | 11/1991 |
| JP | 61 101 105 A | 5/1996 |

OTHER PUBLICATIONS

Heinz Sarkowski (ed.): "Dimensionierung von Halbleiterschaltungen" [dimensioning of semiconductor circuits], Lexika–Verlag Grafenau–Döffingen, $2^{nd}$ revised edition, 1974, pp. 76–79.

* cited by examiner

Primary Examiner—Jean Gelin
(74) Attorney, Agent, or Firm—Laurence A. Greenberg; Werner H. Stemer; Gregory L. Mayback

(57) ABSTRACT

Conventional circuit configurations for range changeover between different bands (UHF, VHF) in television receivers utilize MOS tetrodes whose operating point adjustment is unproblematic. The MOS tetrodes of the inventive circuit configuration comprise a constant potential at their source electrode regardless of the band that is selected. Besides the savings in terms of components, the invention simplifies the dimensioning of the circuit configuration. The invention can be used in all high-frequency receivers having a plurality of frequency ranges between which a changeover is performed.

9 Claims, 1 Drawing Sheet

CIRCUIT CONFIGURATION FOR BAND CHANGEOVER IN HIGH-FREQUENCY RECEIVERS

CROSS-REFERENCE TO RELATED APPLICATION

This is a continuation of copending international application PCT/DE99/01165, filed Apr. 16, 1999, which designated the United States.

BACKGROUND OF THE INVENTION

Field of the Invention

The invention relates to a circuit configuration for changing over the reception bands in high-frequency receivers, particularly in television and radio receivers. High-frequency receivers serve for selecting a desired frequency from a plurality of frequencies which are fed to the receiver, for instance via an antenna. The desired frequency is separated from the rest of the received frequencies, and the signal that is transmitted with that frequency is acquired by demodulation. The reception of different television or radio programs is possible by tuning the receiver to the frequency on which the respective program is broadcast.

The frequencies that are used for transmission purposes are divided into ranges, which are characterized as frequency bands. Receivers can typically be set to one frequency band or to several bands. The advantage of this is that a receiving unit need not be designed for all frequencies that are to be received; rather, subreceiver units that cover only one frequency band each can be provided. The tuning circuits in the subreceiver units are then optimized to the relatively small frequency spectrum of the respective band. Because one receiver unit is not provided to which all receivable frequencies are fed, but rather one of the subreceiver units must be selected according to the frequency that must be detected, a frequency band changeover is required. With the band changeover, that subreceiver unit is active which is allocated to the frequency band in which the desired frequency lies. The frequency that is detected by the respective subreceiver unit is then fed for further processing (e.g. demodulation) to a stage which is common to all subreceiver units.

The frequencies that are used in television transmission are divided into three bands. The lower VHF band (VHFI) encompasses the frequency spectrum from 45 to 126 MHz; the upper VHF band (VHFII) encompasses the frequencies from 133 to 407 MHz; and the UHF band encompasses the frequency interval from 415 to 860 MHz. For the VHF and UHF bands, electrically independent subreceiver units are usually used, which contain a respective mixer and oscillator. The band changeover is accomplished via specific control signals which switch on the desired mixer and oscillator.

Circuit configurations for band changeover in tuners are taught by EP 0 457 934 and EP 0 457 932. The circuit configuration according to EP 0457 932 is laid out for band changeover in tuners having at least two bands. For each band, an MOS tetrode is provided, which can be activated via a switching device. The MOS tetrode of one of the preliminary stages is active in that its source terminal is connected to the reference potential of the supply voltage via a switching device. The respective preliminary stage can thus be activated via the level of the potential at the source terminal of its tetrode. So that the tetrode is inactive when the source terminal does not lie at reference potential, a well defined potential must be set at a gate terminal and at the source terminal of the tetrode via voltage dividers. The disadvantage herein is that resistors with a low tolerance range must be used for the voltage divider. Another disadvantage is that the output signal at the drain terminal of the tetrode is dependent upon the dimensioning of the voltage divider.

SUMMARY OF THE INVENTION

It is accordingly an object of the invention to provide a circuit configuration for band changeover in high-frequency receivers which overcomes the above-mentioned disadvantageous of the prior art circuits of this general type, that is compatible with existing high-frequency receivers in terms of function and software and that has a reduced wiring and design outlay as compared to prior art circuits.

With the foregoing and other objects in view there is provided, in accordance with the invention, a circuit configuration for changing between at least two bands in a high-frequency receiver, that includes a plurality of amplifier stages with a first amplifier stage associated with one of the at least two bands and a second amplifier stage associated with another one of the at least two bands. A switching mechanism is included for activating one of the plurality of amplifier stages at a time and thereby selecting one of the at least two bands. Each one of the plurality of amplifier stages includes a semiconductor switch element having two terminals connected in a main current path and having two control electrodes. One of the two terminals of the semiconductor switch element of each one of the plurality of amplifier stages is connected to a constant potential irregardless of which of the at least two bands is selected. The switching mechanism activates one of the plurality of amplifier stages at a time via one of the two control electrodes of the semiconductor switch element of the activated one of the plurality of amplifier stages.

The invention has the advantage that the resistors for the voltage divider at the source terminal are forgone. Accordingly, the dimensions of the layout are also reduced. Lastly, the space consumption of the inventive circuit configuration is reduced compared to conventional circuit configurations, which is particularly important in realizations in an integrated circuit.

In accordance with an added feature of the invention, the output signal of the semiconductor switch element is not dependent upon the wiring of the source terminal.

In accordance with an additional feature of the invention, the reference potential of the supply voltage is used as constant potential. Potential fluctuations can then be minimized without additional measures.

In accordance with another feature of the invention, one of the bands is divided into sub-bands by connecting a selection circuit. The coupling of an amplifier stage to the selection circuit is advantageous particularly for VHF band, which comprises lower and upper ranges.

In accordance with a concomitant feature of the invention, when the selection circuit that is provided for one range is connected to the control electrode of the semiconductor component for the other range in such a way that the selection circuit is only active when this semiconductor component is switched out. To this end, the selection circuit can be active in such a way that it is connected to the reference potential in a switchable fashion and is continuously at the supply voltage. When the selection circuit is connected to the reference potential, the control electrode of this semiconductor component is simultaneously brought approximately to the reference potential, whereupon it blocks. Simple npn transistors whose emitters are connected to the reference potential can be used for the circuit.

Other features which are considered as characteristic for the invention are set forth in the appended claims.

Although the invention is illustrated and described herein as embodied in a circuit configuration for band changeover in high-frequency receivers, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

DESCRIPTION OF THE PREFERRED EMBODIMENTS

Figure 1:
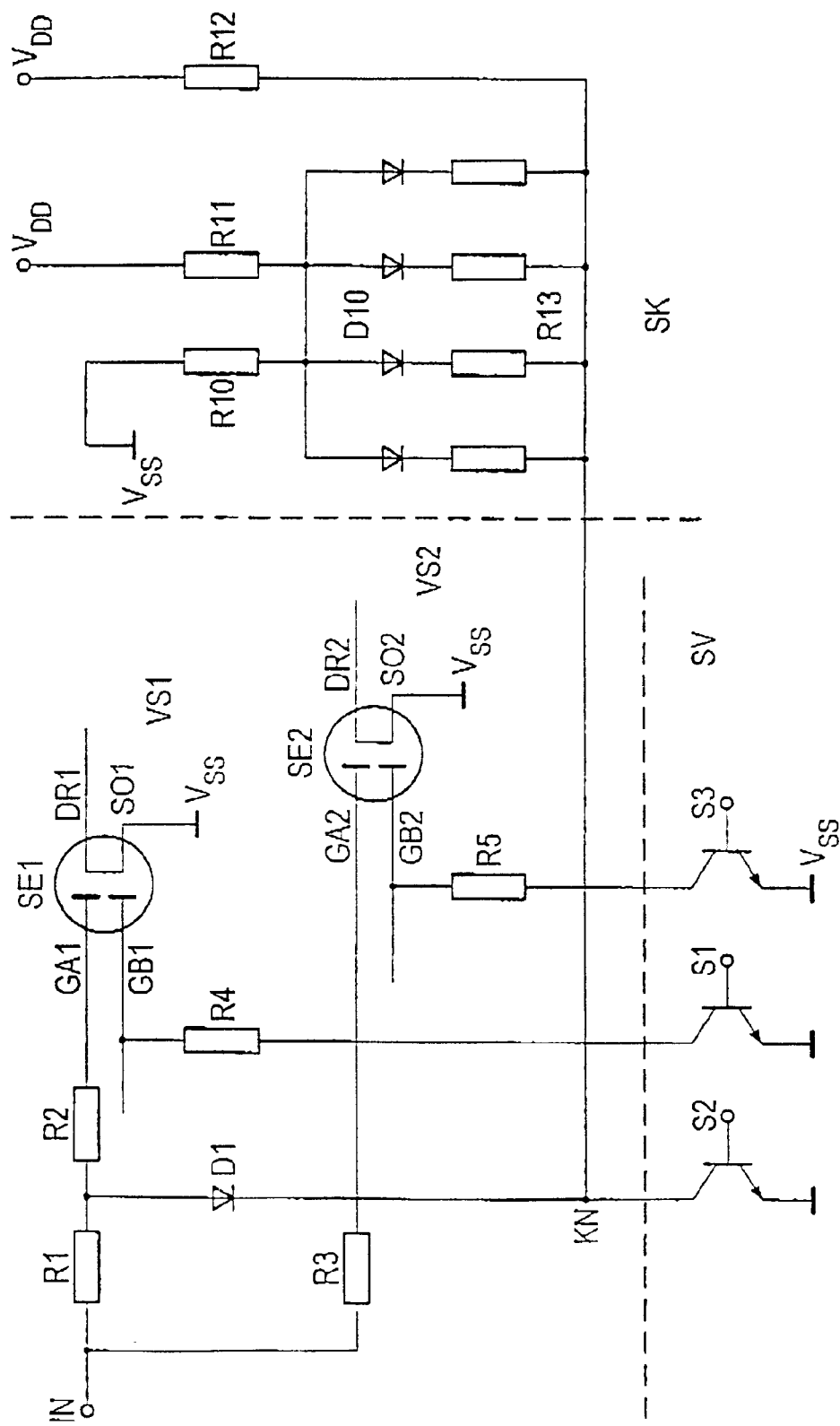
FIG. 1 shows a circuit configuration for changing between at least two bands in a high-frequency receiver.

Referring now to the sole drawing figure, FIG. 1, there is shown a circuit configuration that contains a first semiconductor switch element SE1, which is an element of a first amplifier stage VS1, and a second semiconductor switch element SE2, which belongs to a second amplifier stage VS2. The amplifier stages VS1, VS2 are each allocated to a respective frequency band. In the exemplifying embodiment shown in FIG. 1, the first amplifier stage VS1 is provided for the UHF band, and the second amplifier stage VS2 is provided for the VHF band.

The semiconductor switch elements SE1, SE2 each comprise two control electrodes GA1, GB1; GA2, GB2 for controlling a current in a respective main current path between a drain terminal DR1, DR2 and a source terminal SO1, SO2. An input terminal IN via which a control signal is fed to the circuit configuration is connected to the first control electrode GA1 of the first semiconductor switch element SE1 via two resistors R1, R2 that are connected in series. At the common junction of the resistors R1, R2, the anode terminal of a switching diode D1 is provided. The cathode terminal of the switching diode D1 is connected to a node KN. The second control electrode GB1 of the first semiconductor switch element SE1, to which a first high-frequency signal can be fed, is connected to a terminal for a reference potential $V_{ss}$ via a resistor R4 which is connected in series with a switch S1. The node KN is likewise connected to the terminal for the reference potential $V_{ss}$ via a second switch S2. A third switch S3 connects the terminal for the reference potential $V_{ss}$ to the second control electrode GB2 of the second semiconductor switch element SE2 via a resistor R5. The first control electrode GA2 of this semiconductor switch element SE2 is connected to the input terminal IN via a resistor R3. The second control electrode GB2 can be fed a second high-frequency signal. The switches S1, S2, S3 together form a switching mechanism SV. They can be realized as npn transistors which are connected on the emitter side to the terminal for the reference potential $V_{ss}$. The control of the switching mechanism SV occurs via the base terminals of the transistors S1, S2, S3.

The source terminals SO1, SO2 of the semiconductor switch elements SE2, SE2 are likewise connected to the terminal for the reference potential $V_{ss}$. Additional amplifier stages that are provided for other corresponding frequency bands, and that are not represented in FIG. 1, are connected in series with the drain terminals DR1, DR2.

The node KN is connected to the changeover resistors R13 and via an adjusting resistor R12 to a supply potential $V_{DD}$. The changeover resistors R13 are each connected to the cathode terminal of a respective changeover diode D10. The anode terminals of the changeover diodes D10 are connected to each other. The interconnected anode terminals of the changeover diodes D10 are connected to the common junction of a voltage divider that consists of a resistor R10 and a resistor R11. The voltage divider R10, R11 is connected between the reference potential $V_{ss}$ and the supply potential $V_{DD}$.

The selection circuit shown in FIG. 1 has four changeover resistors R13 with four appertaining changeover diodes D10. Besides the semiconductor switch elements SE1, SE2, each of the amplifier stages VS1, VS2 contains tuning circuits, which are not shown in the Figure. The selection circuit SK of the subreceiver for the VHF band makes it possible to switch over the resonant frequency of inductors of the VHF subreceiver between the lower and upper VHF bands by means of the changeover diodes D10. The inductors are not shown in FIG. 1.

The range changeover is accomplished using specific control signals that are applied to the switches S1, S2, S3 of the switching mechanism SV. In the present exemplifying embodiment, digital control signals are used which are sent to the base terminals of npn transistors that comprise the switches S1, S2, S3. For each npn transistor, a separate digital control signal is provided. The digital control signals comprise a first voltage level (control signal low) at which the npn transistors block, and a second voltage level (control signal high) at which they conduct. The base terminals are used as control inputs of the npn transistors.

The circuit configuration shown in FIG. 1 is laid out such that at a given point in time the control signal high can only be applied to exactly one of the switches S1, S2, S3. The switches to which the switching signal high is not being fed are controlled with the switching signal low. The switches S1, S2, S3 are addressed via a control logic that controls a microprocessor in a television device, for example. The control device SV itself can be realized as part of a PLL circuit.

Three separate cases can be distinguished depending on the switch S1, S2, S3 at which the switching signal high is present. This assumes that the first amplifier stage VS1 is laid out for the UHF band, and the second amplifier stage VS2 is laid out for the VHF band.

The UHF band is active when the control signal high is fed to the third switch S3, and the control signal low is fed to the switches S1 and S2. The switch S3 then conducts and connects the reference potential $V_{ss}$ via the resistor R5 to the second control electrode GB2 of the second semiconductor switch element SE2, whereupon this blocks. Actuation cannot be accomplished by the second high-frequency signal, which is fed via the second control electrode GB2. This second amplifier stage VS2 for the VHF band is then inactive. On the other hand, the first semiconductor switch element SE1 is active, since its second control electrode GB1 is separated from the reference potential $V_{ss}$, and actuation is accomplished via its first control electrode GA1 by the control signal at the input terminal IN via the path with the resistors R1 and R2, and via its second control electrode GB1 by the first high-frequency signal. The path across the switching diode D1 does not carry a signal, since the switch S2 is open, and the potential is not lower at the cathode of the switching diode D1 than at the anode thereof.

The lower VHF band (VHFI) is active when the control signal high is fed to the first switch S1, and the control signal low is fed to the other switches S2, S3. Via the resistor R4 the second control electrode GB1 of the first semiconductor switch element SE1 is then connected to the reference potential $V_{ss}$, whereupon this blocks. Control cannot be accomplished via the control signal at the first control electrode GA1 of the first semiconductor switch element SE1. The UHF band is inactive. On the other hand, the second semiconductor switch element SE2 is actuated by the control signal at the input terminal IN, which is fed to the first control electrode GA2 thereof via the resistor R3.

The second control electrode GB2 of the second semiconductor switch element SE2 is not connected to the low potential. The VHF band is active. Since the switch S2 is open, the selection circuit SK is not active. The second amplifier stage VS2 is then tuned to the lower VHF band.

The upper VHF band is active when the second switch S2 is fed the control signal high, and the remaining switches S1 and S3 are fed the control signal low. The switching diode D1 switches, since its cathode is connected to the reference potential $V_{ss}$ and has a lower potential than its anode. Via the switching diode D1 and the resistor R2, the first control electrode GA1 of the first semiconductor switch element SE1 is connected to the reference potential $V_{ss}$. This consequently blocks, and the UHF band is inactive. The second semiconductor switch element SE2 is controlled by the control signal at the input terminal IN via the first control electrode GA2 of the second semiconductor switch element SE2 and by the second high-frequency signal via its second control electrode GB2. The second control electrode GB2 is not connected to the reference potential $V_{ss}$; the VHF band is thus active. Since the switch S2 is closed, the selection circuit SK lies between the reference potential $V_{ss}$ and the supply potential $V_{DD}$. A current thus flows from the higher supply potential to the lower reference potential, and the selection circuit is active. The second amplifier stage VS2 is tuned to the upper VHF band (VHFII).

It is advantageous when the control signal at the input terminal IN is provided by an AGC circuit (automatic gain control). By adjusting the operating point of the respective semiconductor switch element SE1, SE2, this type of control voltage source guarantees that the output signal of the amplifier stages VS1, VS2 experiences only slight fluctuations, regardless of the field strength of the signal, which is received via an antenna, for instance.

The value of the resistor R1 is selected large enough that the AGC circuit is loaded only slightly given a closed switch S2 and thus a signal flow from the input terminal IN to the reference potential $V_{ss}$.

The resistor R11 together with the resistor R10 of the selection circuit SK form a voltage divider, which holds the potential at the anodes of the changeover diodes D10 to a value that is less than the supply potential $V_{DD}$. When the switch S2 is open, the changeover diodes D10 are blocked. Only when the switch S2 is closed—that is, upon activation of the upper VHF band—is the cathode potential of the changeover diodes D10 suppressed, so that these conduct. As a result, connected inductors are shorted, and the resonant frequencies of the appertaining tuning circuit is adjusted to the upper VHF band.

The voltage divider R10, R11 can also be replaced by a diode between the supply potential $V_{DD}$ and the anodes of the changeover diodes D10.

The switching diode D1 decouples the selection circuit SK from the first control electrode GA1 of the first semiconductor switch element SE1. A dual gate MOSFET is a suitable semiconductor switch element.

The circuit configuration for band changeover as represented in FIG. 1 can be part of a tuner-Ics with mixer, oscillator, IF, preamplifier and PLL functions.

We claim:

1. A circuit configuration for changing between at least two bands in a high-frequency receiver, comprising;
   a plurality of amplifier stages including a first amplifier stage associated with one of the at least two bands and a second amplifier stage associated with another one of the at least two bands; and
   a switching mechanism for activating one of said plurality of amplifier stages at a time and thereby selecting one of the at least two bands;
   each one of said plurality of amplifier stages including a semiconductor switch element having two terminals connected in a main current path and having two control electrodes, one of said two terminals of said semiconductor switch element of each one of said plurality of amplifier stages connected to a constant potential irregardless of which of the at least two bands is selected;
   said switching mechanism activating the one of said plurality of amplifier stages at a time via one of said two control electrodes of said semiconductor switch element of the activated one of said plurality of amplifier stages.

2. The circuit configuration according to claim 1, wherein the constant potential is a reference potential of a supply voltage.

3. The circuit configuration according to claim 1, comprising a selection circuit coupled to the first amplifier stage such that a natural frequency of the one of the two bands associated with the second amplifier stage is adjusted.

4. The circuit configuration according to claim 3, wherein said selection circuit is connected to one of said two control electrodes of said semiconductor switch element of said first amplifier stage in such a way that said selection circuit is inactive when said semiconductor switch element of said first amplifier stage is switched into a conductive mode via this control electrode.

5. The circuit configuration according to claim 4, wherein said selection circuit includes a plurality of series circuits connected in parallel, each one of said plurality of series circuits including a diode and a resistor connected in series.

6. The circuit configuration according to claim 3, wherein said selection circuit includes a plurality of series circuits connected in parallel, each one of said plurality of series circuits including a diode and a resistor connected in series.

7. The circuit configuration according to claim 3, wherein:
   said selection circuit includes a terminal;
   said switching mechanism includes a first switch, a second switch, and a third switch;
   one of said two control electrodes of said semiconductor switch element of said first amplifier stage and said terminal of said selection circuit are connected to a reference potential via said second switch;
   the other one of said two control electrodes of said semiconductor switch element of said first amplifier stage connected to the reference potential via said first switch; and
   one of said two control electrodes of said semiconductor switch element of said second amplifier stage is connected to the reference potential via said third switch.

8. The circuit configuration according to claim 7, comprising a switching diode connecting said second switch to said one of said two control electrodes of said semiconductor switch element of said first amplifier stage that is connected to the reference potential via said second switch.

9. The circuit configuration according to claim 1, wherein said semiconductor switch element is a dual gate MOSFET.

* * * * *